(12) United States Patent
Fu et al.

(10) Patent No.: US 9,141,745 B2
(45) Date of Patent: Sep. 22, 2015

(54) METHOD AND SYSTEM FOR DESIGNING FIN-FET SEMICONDUCTOR DEVICE

(71) Applicant: Taiwan Semiconductor Manufacturing Co., Ltd., Hsin-Chu (TW)

(72) Inventors: Chung-Min Fu, Chungli (TW); Yung-Fong Lu, Keelung (TW); Chung-Hsing Wang, Baoshan Township (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 14/068,064

(22) Filed: Oct. 31, 2013

(65) Prior Publication Data

US 2015/0121329 A1     Apr. 30, 2015

(51) Int. Cl.
G06F 17/50     (2006.01)
(52) U.S. Cl.
CPC .................................. *G06F 17/5068* (2013.01)
(58) Field of Classification Search
CPC ........ G06F 17/30; G06F 17/50; H01L 29/785
USPC ........... 716/133; 257/347, E27.111, E21.703; 438/151
See application file for complete search history.

(56) References Cited

U.S. PATENT DOCUMENTS

| 8,392,861 | B2 | 3/2013 | Shibatani et al. | |
|---|---|---|---|---|
| 8,440,517 | B2 | 5/2013 | Lin et al. | |
| 8,497,171 | B1 | 7/2013 | Wu et al. | |
| 2008/0283925 | A1* | 11/2008 | Berthold et al. | 257/368 |
| 2011/0227162 | A1 | 9/2011 | Lin et al. | |
| 2012/0007180 | A1 | 1/2012 | Yin et al. | |
| 2013/0141963 | A1 | 6/2013 | Liaw | |
| 2014/0181774 | A1* | 6/2014 | Hatamian et al. | 716/122 |
| 2014/0183646 | A1* | 7/2014 | Hatamian et al. | 257/369 |
| 2014/0264485 | A1* | 9/2014 | Li et al. | 257/288 |

OTHER PUBLICATIONS

Kuhn, K.J. et al., "The Ultimate CMOS Device and Beyond", 2012 IEEE International Electron Devices Meeting, (IEDM), Dec. 2012, 4 pages.
Scholarly Paper "Compact Modelling of Advanced Devices",9 pages, retrieved from: http://www-iness.c-strasbourg.fr/Compact-modelling-of-advanced.

(Continued)

*Primary Examiner* — Mohammed Alam
(74) *Attorney, Agent, or Firm* — Duane Morris LLP (57) ABSTRACT

A method includes providing a first layout of a semiconductor device comprising a plurality of cells representing circuit elements, and providing a cell library comprising a plurality of cells in a processor. The circuit elements comprise a plurality of fin field effect transistors (Fin-FETs). Each of the plurality of cells in the cell library is displayed with a respectively different marker indicating a respective fin height. The method further includes generating a second layout for the semiconductor device to be fabricated, by placing or replacing at least one cell from the cell library in a respective location in the first layout. The at least one cell from the cell library comprises a Fin-FET with a respective fin height different from an adjacent Fin-FET in the second layout.

17 Claims, 9 Drawing Sheets

(56) References Cited

OTHER PUBLICATIONS

Sohn, C.W. et al., "Effect of Fin Height of Tapered FinFETs on the Sub-22 nm System on Chip (SoC) Application using TCAD simulation", 2013 International Symposium on VLSI Technology, Systems, and Applications (VLSI-TSA), Apr. 2013, 2 pages.

Huang, X., et al., "Sub 50-nm FinFET: PMOS", International Electron Devices Meeting, IEDM '99, Dec. 1999, 5 pages.

* cited by examiner

METHOD AND SYSTEM FOR DESIGNING FIN-FET SEMICONDUCTOR DEVICE

FIELD

This disclosure relates to semiconductor fabrication generally, and more specifically to electronic design automation tools.

BACKGROUND

With increased considerations of cost and reliability, there is a continuous demand for semiconductor devices with higher levels of integration, i.e., higher packing densities of transistors and other devices. In order to increase levels of integration, Fin-FET (fin Field Effect Transistor) devices are becoming popular in semiconductor integrated circuits and other semiconductor devices in various applications.

Fin-FET devices include semiconductor fins with high aspect ratios that extend above the substrate surface and are formed vertically with respect to a top surface of the substrate. In the semiconductor fin, channel and source/drain regions of semiconductor transistor devices are formed. The fins are isolated, raised structures. The channel region has an increased area with respect to transistors with planar channels. A gate is formed over and along the sides of the fins, utilizing the advantage of the increased surface area of the channel and source/drain regions to produce faster, more reliable and better-controlled semiconductor transistor devices. One important advantage of Fin-FET technology is that the mismatch between the devices can be significantly lower than that under planar manufacturing processes.

BRIEF DESCRIPTION OF THE DRAWINGS

The present disclosure is best understood from the following detailed description when read in conjunction with the accompanying drawings. It is emphasized that, according to common practice, the various features of the drawings are not necessarily to scale. On the contrary, the dimensions of the various features are arbitrarily expanded or reduced for clarity. Like reference numerals denote like features throughout specification and drawings.

DETAILED DESCRIPTION

This description of the exemplary embodiments is intended to be read in connection with the accompanying drawings, which are to be considered part of the entire written description. In the description, relative terms such as "lower," "upper," "horizontal," "vertical,", "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

This present disclosure provides a method and a system for generating a design of a semiconductor device comprising Fin-FET structures.

Figure 1A:
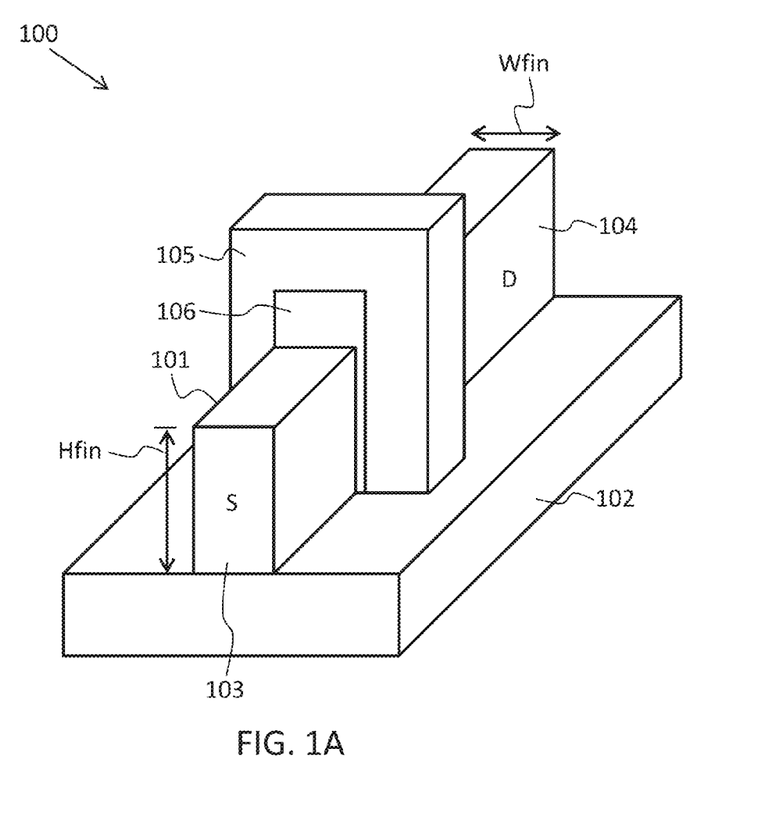
FIG. 1A illustrates an exemplary fin field effect transistor (Fin-FET).

FIG. 1A illustrates an exemplary fin field effect transistor (Fin-FET) 100 having a fin structure 101. Fin structure or fin 101 is disposed on a substrate 102. Fin 101 includes a source region 103 and a drain region 104. A gate structure 105 is disposed over and around fin 101. Gate structure 105 is insulated from fin 101 by a thin gate oxide layer 106. A channel region (not shown) is disposed between source region 103 and drain region 104, and is concealed by gate oxide layer 106 and gate structure 105. In FIG. 1A, "Hfin" and "Wfin" represent the height and the width (or thickness) of fin 101, respectively.

Figure 1B:
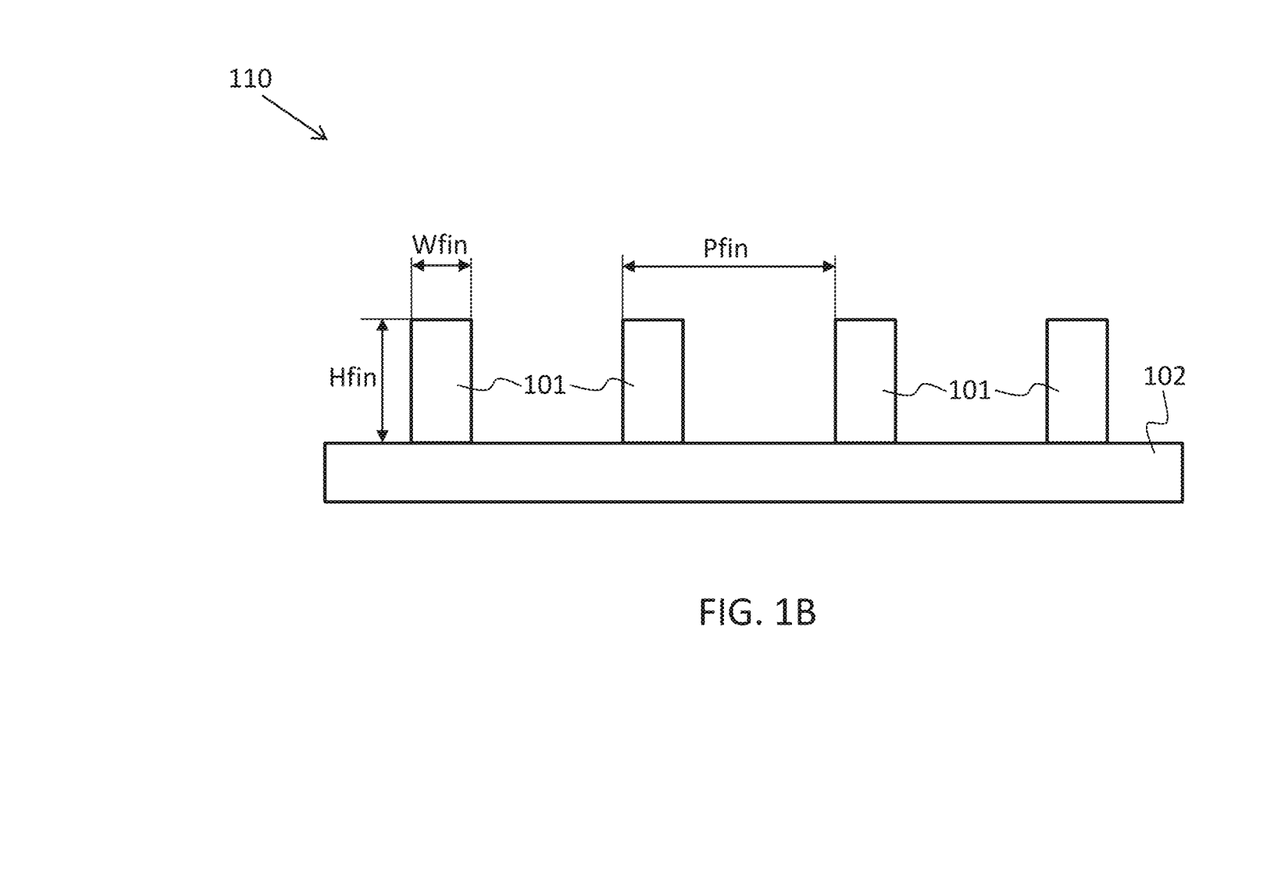
FIG. 1B is a cross-sectional view illustrating an exemplary Fin-FET having multiple fin structure.

FIG. 1B is a cross-sectional view illustrating an exemplary Fin-FET having a multiple fin structure 110. In FIG. 1B, like items are indicated by like reference numerals, and for brevity, descriptions of the structure, provided above with reference to FIG. 1A, are not repeated. Multiple fin structure 110 has a plurality of parallel fin structures 101, with a pitch represented by "Pfin" as shown in FIG. 1B.

As shown in FIGS. 1A and 1B, an effective transistor gate width (Weff) is twice the height of fin 101 plus the width of fin (i.e. Weff=2 Hfin+Wfin). In some embodiments, the width (or thickness) of fin 101 is adjusted in a design of a semiconductor device comprising Fin-FET 100 having a fin structure 101, particularly a semiconductor device comprising multiple fin structure 110.

The inventors have determined that adjustment in height of a fin 101 or multiple fin structure 110 in one or more cells can be used as a "tuning knob" in generating a design of a semiconductor device comprising Fin-FET structures. In some embodiments, this "tuning knob" is used to design a three-dimensional (3D) Fin-FET semiconductor device, particularly those having a plurality of cells having multiple fin structures in a fixed area. In some embodiments, a cell library comprising a plurality of cells is generated. In such a cell library, each of the plurality of cells is displayed with a respectively different marker indicating a respective fin height. Such a cell library can be used to improve a first layout of a semiconductor device and generate a second layout for the semiconductor device to be fabricated, while satisfying challenging performance specifications for the semiconductor device. For example, in some embodiments, an increase in the height of fin (Hfin) results in a decrease in the gate threshold voltage (Vt) of a respective Fin-FET. Meanwhile, other performance specifications such as timing (speed) and power consumption of the semiconductor device can also be satisfied.

Figure 2A:
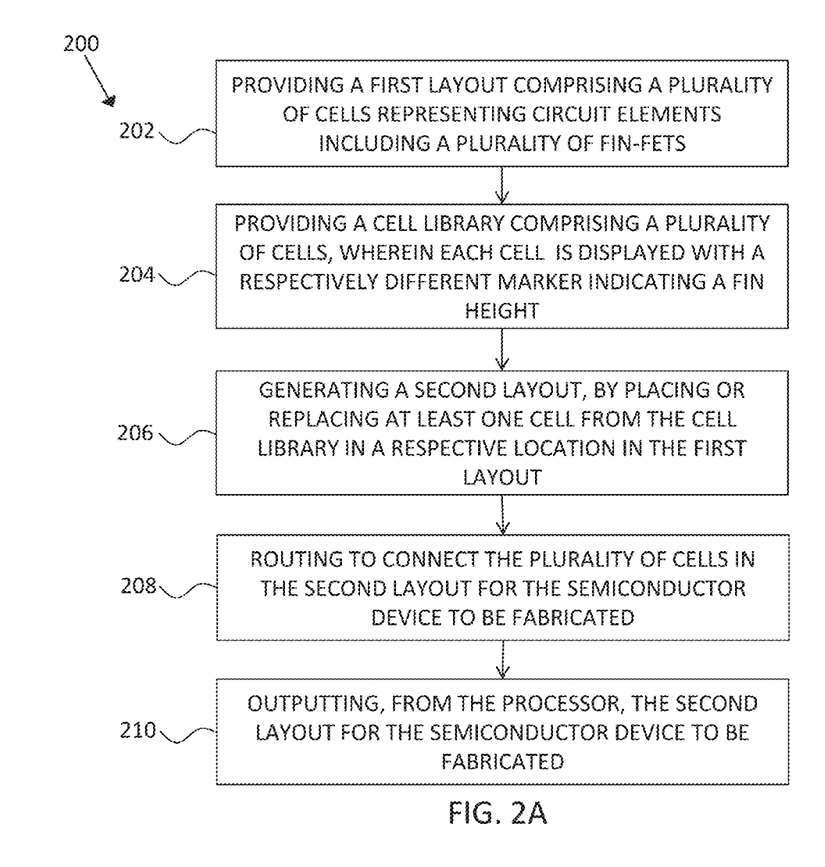
FIG. 2A is a flow chart illustrating an exemplary method for generating a design of a semiconductor device in accordance with some embodiments.
Figure 2B:
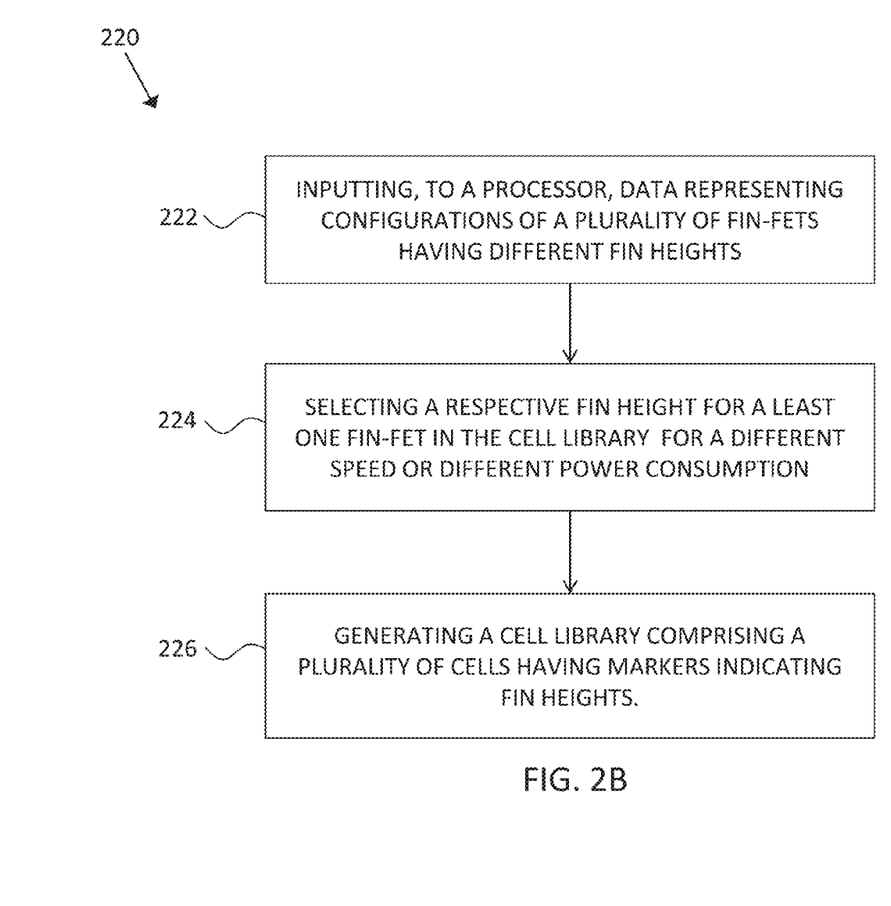
FIG. 2B is a flow chart illustrating an exemplary method for providing a cell library comprising a plurality of cells, wherein each cell is displayed with a respectively different marker indicating a fin height in accordance with some embodiments.
Figure 2C:
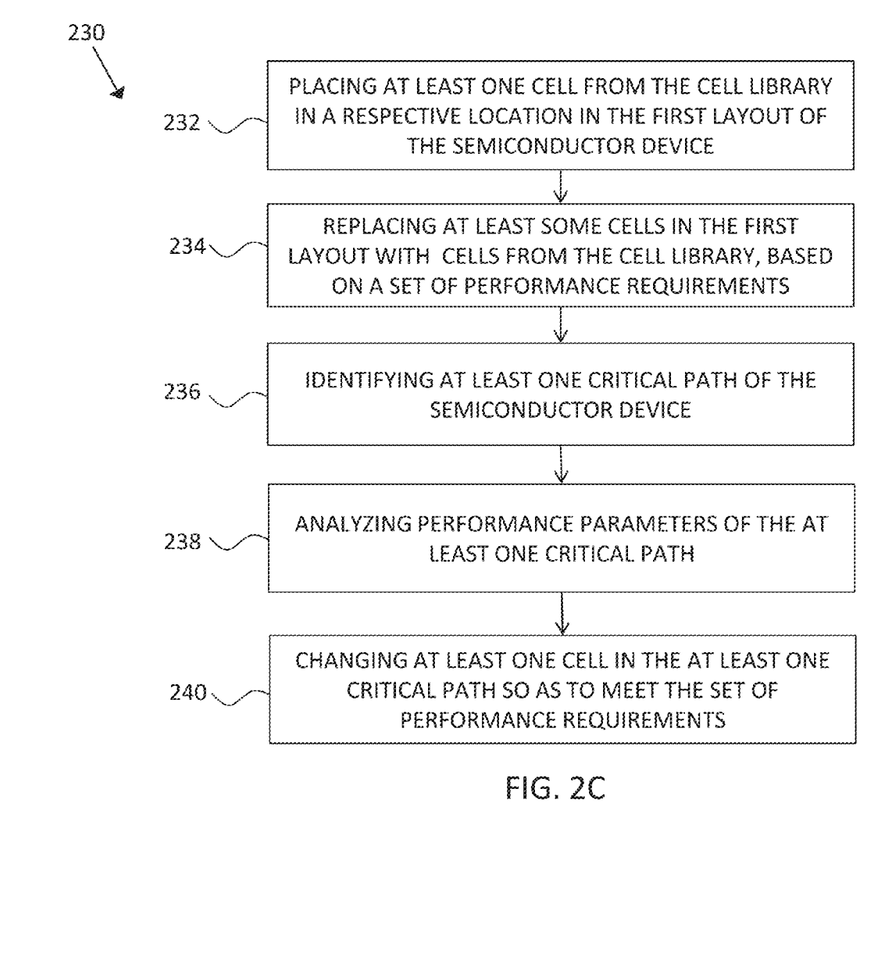
FIG. 2C is a flow chart illustrating an exemplary method for generating a second layout by placing or replacing at least one cell from the cell library in a respective location of the first layout in some embodiments.

FIG. 2A illustrates an exemplary method 200 for generating a design of a semiconductor device in accordance with some embodiments. FIG. 2B illustrates an exemplary method 220 for providing a cell library at step 204 of FIG. 2A. FIG. 2C illustrates an exemplary method 230 for generating a second layout by placing or replacing at least one cell from the cell library in a respective location of the first layout at step of 206 of FIG. 2A in some embodiments. The methods described in FIGS. 2A-2C are described with reference to the exemplary layout described in FIG. 3A, and the block diagram described in FIG. 4.

At step 202 of FIG. 2, a first layout of a semiconductor device is provided. The first layout comprises a plurality of cells representing circuit elements, which comprises a plurality of fin field effect transistors (Fin-FETs). In some embodiments, the plurality of cells in the first layout of the semiconductor device comprises Fin-FETs having the same fin height. The plurality of cells in the first layout can be selected from a first cell library based on design rules.

Figure 3A:
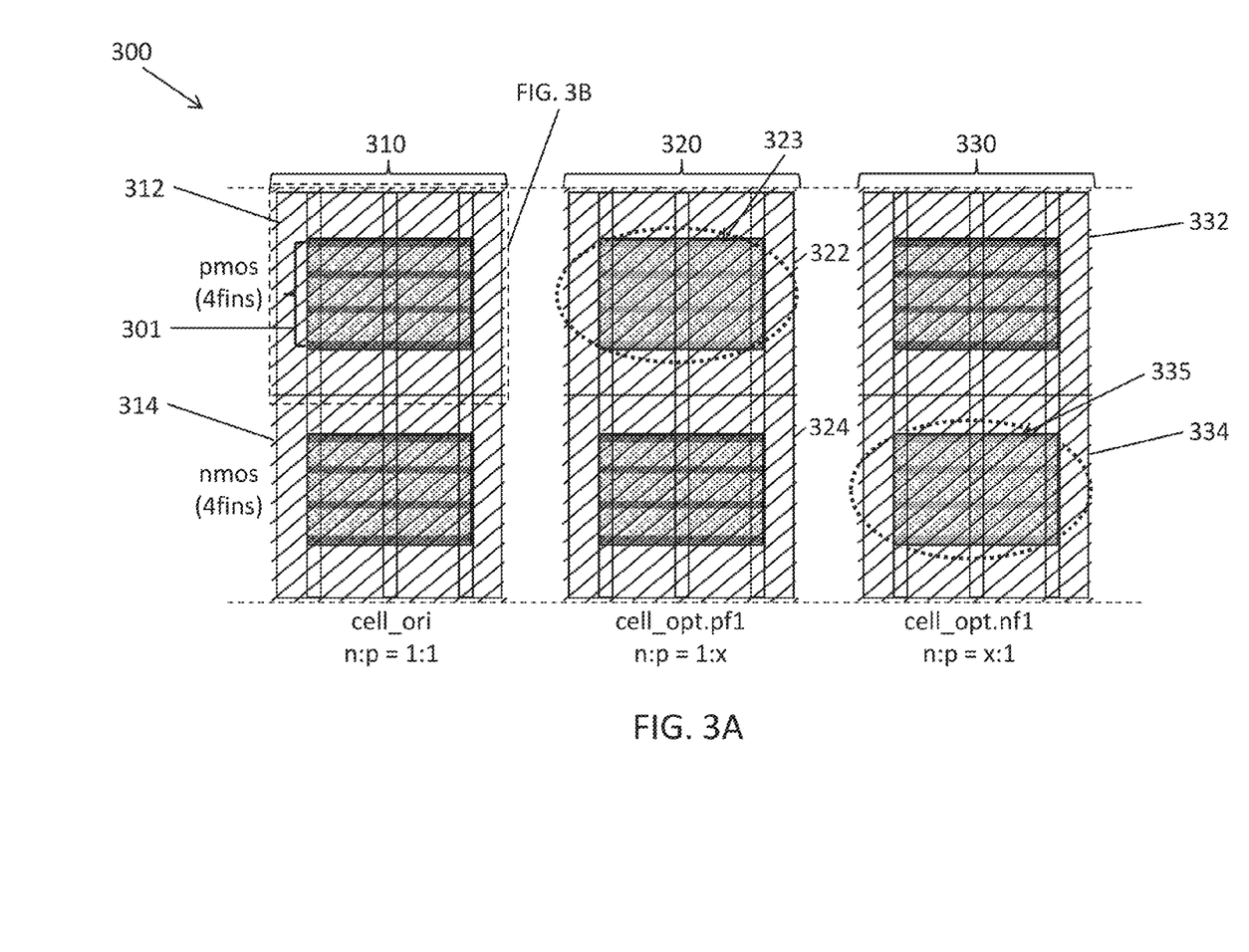
FIG. 3A illustrates an exemplary layout of a semiconductor device in accordance with some embodiments.

Referring to FIG. 3A, a pair of cells 310, for example, can be a portion of the first layout of a semiconductor device. The pair of cells 310 comprises a PMOS cell 312 an NMOS cell 314, each of which comprises FETs with four fins 301 of the same fin height. In the example of FIG. 3A, the pair of cells 310 is a portion of a layout for a normal N/P balance inverter cell, but the Fin-FETs can be used in a variety of devices and circuits. The Fin-FETs having the same fin height provides a performance ratio of NMOS and PMOS equal to 1:1 (n:p=1:1).

Figure 3B:
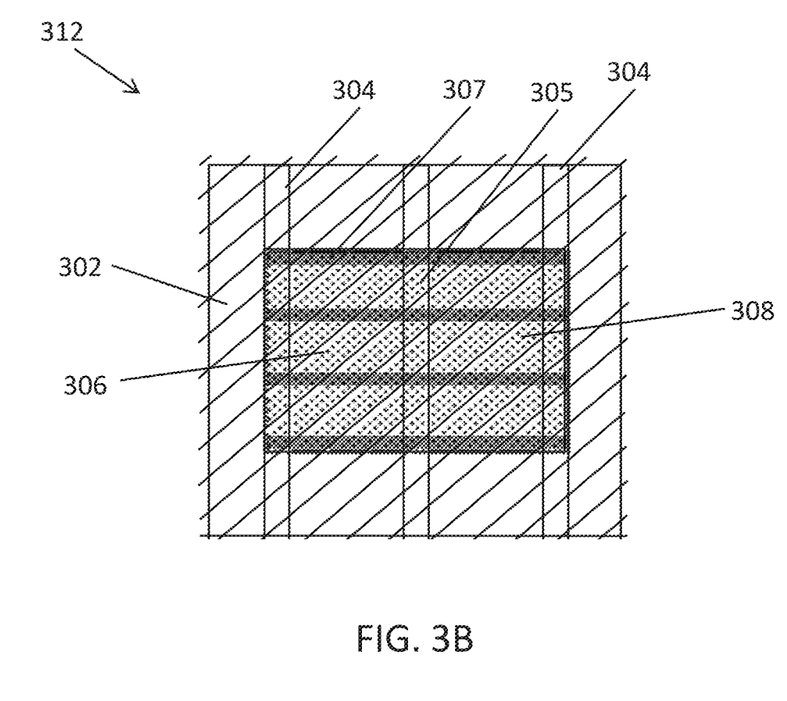
FIG. 3B is a magnified view of an exemplary cell in a layout of a semiconductor device.

FIG. 3B is a magnified view of an exemplary cell 312 in the first layout of a semiconductor device. The exemplary cell 312 comprises a four-fin FET structure, which comprises active gates 305, and source and drain regions 306 and 308 on both sides of active gates 305, over a substrate 302 comprising P+ type semiconductor. The Fin-FET structure may also comprises dummy gates 304. A marker 307 is used to indicate the height of the Fin-FET structure. In some embodiments, marker 307 is on the active gates 305, and source and drain regions 306 and 308. Other different ways of marker assignment can also be used. For example, a marker 307 can cover the whole cell 312.

At step 204 of FIG. 2, a cell library comprising a plurality of cells is provided in a processor. The cell library is stored in a non-transitory, machine readable storage medium, such as a memory, hard disk drive, CD-ROM drive, flash drive, or the like. Each of the plurality of cells in the cell library is displayed with a respectively different marker indicating a respective fin height.

In some embodiments, the plurality of cells having different heights in the cell library include one or more Fin FETs having timing or power consumption different from corresponding devices formed by the plurality of cells in the first layout. In some embodiments, for each Fin FET in the first layout, at least one corresponding Fin FET is provided in the second library. In some embodiments, for each Fin FET in the first layout, two or more corresponding Fin FETs having at least one different characteristic from each other are provided in the second library. A respectively different marker indicates a respective fin height relative to the original height of the plurality of cells in the first layout. For example, in some embodiments, each Fin FET having a different height is displayed on a display device using a respectively different color, shading style, or the like. Multiple markers can be used to indicate different relative increases. For example, the first marker can represent an increase in a fin height by 5%. The second marker can represent an increase in a fin height by 10%.

FIG. 2B illustrates an exemplary method 220 for providing a cell library at step 204 of FIG. 2A in some embodiments. Step 204 can comprise steps 222, 224, and 226.

At step 222, data representing configurations of a plurality of Fin-FETs having different fin heights is input to a processor.

At step 224, a respective fin height is selected for a least one Fin-FET in the cell library so that the at least one Fin-FET has a different speed or different power consumption from a respective Fin-FET in the first layout. In some embodiments, the cell library has at least one Fin-FET with higher speed and lower power consumption than a respective Fin-FET in the first layout of the semiconductor device.

For a given cell, both speed (timing) and power consumption are considered to determine an adjustment to the fin height. In some embodiments, a higher speed is desired. A fin height (Hfin) is to be increased. An increase in fin height (Hfin) results in an increase in an effective transistor gate width (Weff), and thus an increase in gate threshold voltage (Vt), which results in higher current for higher speed. On the other hand, a higher current may increase power consumption. A suitable fin height can be selected to provide a higher speed, while keeping a desirable power consumption or decrease power consumption of the portion of a semiconductor device represented by the respective cell.

At step 226, a cell library comprising a plurality of cells is generated in the processor. Each of the plurality of cells in the cell library is displayed with a respectively different marker indicating a respective fin height. The plurality of cells having different fin heights in this cell library are then used to generate a second layout for the semiconductor to be fabricated.

At step 206 of FIG. 2, a second layout is generated in the processor. The second layout is provided for the semiconductor device to be fabricated. The second layout can be generated by placing at least one cell from the cell library, or replacing a respective Fin FET in the first layout of the semiconductor device with at least one corresponding cell from the cell library. The at least one cell from the cell library comprises a Fin-FET with a respective fin height different from an adjacent Fin-FET in the second layout of the semiconductor device.

In the second layout, the at least one cell from the cell library comprising a Fin-FET with a respective fin height different is displayed with a respectively different marker. A respectively different marker indicates a respective fin height relative to the original height of the plurality of cells in the first layout in some embodiments. For example, in some embodiments, each Fin FET having a different height is displayed on a display device using a respectively different color, shading style, or the like. Multiple markers can be used to indicate different relative increases. For example, the first marker can represent an increase in a fin height by 5%. The second marker can represent an increase in a fin height by 10%.

FIG. 2C illustrates an exemplary method 230 for generating a second layout by replacing a respective Fin FET of the first layout with at least one corresponding cell from the cell library at step 206 of FIG. 2A in some embodiments. Step 206 can comprise one or more steps in method 230. For example, step 206 can comprise steps 232 and 234 in some embodiments. Step can also comprise steps 236, 238 and 240 in some other embodiments.

At step 232, at least one cell from the cell library is placed in a respective location in the first layout. The at least one cell from the cell library has a fin height different from the fin height of the plurality of cells in the first layout.

At step 234, at least some of the plurality of cells in the first layout are replaced with one of the plurality of cells from the cell library, based on a set of performance specifications for the semiconductor device. Based on the set of performance specifications, the design of the semiconductor device is optimized through different cell placements. Steps 232 and/or 234 can be repeated to achieve the desired results meeting the set of performance specification. In some embodiments, the location of the at least some of the plurality of cells in the first layout can be switched or re-arranged. One or more performance parameters in the set of performance specifications can be set as the constraints during the process of optimization, and one or more other performance parameters can be varied.

In some embodiments, the set of performance specifications in the step of optimization through cell replacement comprise at least one of the following specifications: an area for the semiconductor device, speed, power consumption and signal slew rate balance of the semiconductor device. In some embodiments, an area for the semiconductor device is limited. But the semiconductor device as a whole can provide a higher speed, lower power consumption, or a more desirable signal slew rate balance. After each cell replacement, these parameters are calculated in the processor.

In some embodiments, in the step 234 of replacing each of the plurality of cells, a critical path analysis (e.g., a static timing analysis (STA)) can be performed through a method 230 comprising steps 236, 238 and 240.

At step 236 of FIG. 3C, at least one critical path of the semiconductor device is identified. In some embodiments, the at least one critical path is based on timing. One critical path is the slowest path of logic signal transmission from input to output. This critical path may determine the final time of switching.

At step 238, performance parameters of the at least one critical path are analyzed. The speed, power consumption and signal slew rate balance of the semiconductor device can be analyzed, particularly for the at least one critical path.

At step 240, at least one cell in the at least one critical path is changed so as to meet the set of performance specifications for the semiconductor device. After each cell replacement, the speed, power consumption and signal slew rate balance of the semiconductor device can be re-analyzed and compared. Desirable cell placements are selected to meet the set of performance specifications for the semiconductor device, particularly for the critical paths.

In some embodiments, the at least one critical path of the semiconductor device is identified at step 236 is performed before the steps of generating a cell library comprising a plurality of cells having markers indicating different fin heights (step 226), and the optimization of cell placement at step 234. In some embodiments, one cell having the Fin-FETs in the at least one critical path of the first layout are replaced with another cell having Fin-FETs with a different fin height. For example, the fin height in one cell in the critical path of the first layout is increased or decreased. Another cell having Fin-FETs with a different fin height is displayed with a marker indicating a different fin height in the second layout.

In some embodiments, specific modifications performed to the Fin-FETs based on the first layout or based on a deviation between IC timing specifications and simulated performance for the first layout. In some embodiments, if the STA indicates that the path is slower than that on the IC timing specification; faster cells with higher Fin-FETs could replace the slower cells with normal Fin-FETs in the corresponding critical path to meet the IC timing specifications.

Referring again to FIG. 3A, an exemplary second layout 300 of a semiconductor device is shown, in accordance with some embodiments. The exemplary second layout 300 comprises three pairs of cells 310, 320 and 330. The pair of cells 320 and 330 comprises at least one cell having a marker indicating a different fin height compared to the fin height of the plurality of cells in the first layout. For example, in the pair of cells 320, a PMOS cell 322 has a marker 323 indicating that the Fin-FETs in cell 322 have a different fin height. The fin height of cell 322 can be adjusted with an increase or decrease by a certain percentage. The performance ratio of NMOS cell 324 to PMOS cell 322 is changed to 1:x (i.e. n:p=1:x), where x is a positive number, for example, in the range from 0.1 to 10. For example, when cell 322 has a fin height higher than that of cell 324, the performance ratio of NMOS cell 324 to PMOS cell can be adjusted to 1:2.

Similarly, in the pair of cells 330, an NMOS cell 334 has a marker 335 indicating that the Fin-FETs in cell 334 have a different fin height. The performance ratio of NMOS cell 334 to PMOS cell 332 can be changed to x:1 (i.e. n:p=x:1), where x is a positive number, for example, in the range from 0.1 to 10. For example, such a ratio can be adjusted to 2:1 when cell 334 has a higher fin height in some embodiments.

In some embodiments, a respective one of the plurality of cells in the first layout of the semiconductor device is replaced with a respective cell from the cell library having a higher fin height and a lower gate threshold voltage than the one of the plurality of cells. At least one cell from the cell library comprises a Fin-FET with a respective fin height different from an adjacent Fin-FET in the second layout of the semiconductor device. For example, a respective one of the plurality of cells in the first layout of a semiconductor device is a standard voltage threshold (SVT) cell or a low voltage threshold (LVT) cell, and can be replaced with a respective cell in the cell library, having a fin height higher than the height of the SVT cell or the LVT cell. In some embodiments, an SVT cell design with a higher fin height can provide the performance of an LVT cell. Similarly, in some embodiments, after being adjusted to a higher fin height, an LVT cell design can provide the performance of an ultra-low voltage threshold (ULVT) cell.

In some embodiments, as each cell of the first layout is replaced by a cell from the library containing a FinFET with a different height, the layout is displayed with the respective marker corresponding to the replacement cell.

The second layout provided in the present disclosure can provide significant advantages including area saving and device performance improvement. For example, through tuning fin-height, performance of a semiconductor device having multiple Fin-FETs with a respectively different fin height can be 7-9 times as high as the original performance of the semiconductor device having the same fin height. In some embodiments, assuming that the area for the semiconductor device is fixed, the ratio of the performance to the area can be increased significantly, for example, by 75% to 125%.

At step 208 of FIG. 2, routing is performed to connect the plurality of cells in the second layout for the semiconductor device to be fabricated.

At step 210, the processor outputs the second layout for the semiconductor device to be fabricated. The second layout is used to generate a plurality of masks for performing photolithography steps to fabricate integrated circuits in the semiconductor device.

Figure 4:
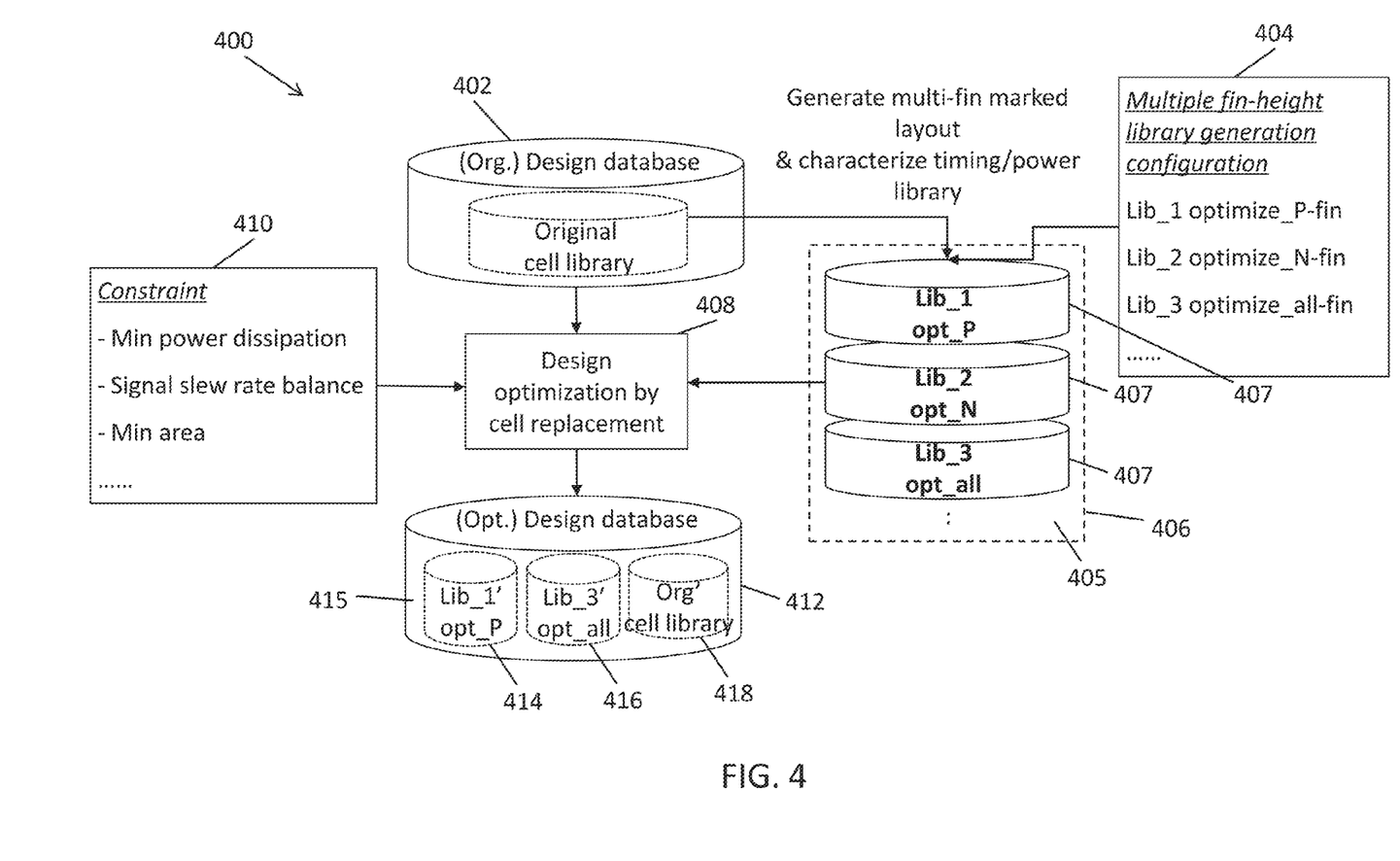
FIG. 4 is a block diagram illustrating an embodiment of a method for generating a design of a semiconductor device as described herein.

FIG. 4 is a block diagram 400 illustrating an embodiment of a method 200 for generating a design of a semiconductor device as described herein.

In block 402, a first layout of a semiconductor device is provided as described in step 202 of FIG. 2A. The first layout comprises a plurality of cells representing circuit elements, which comprises a plurality of fin field effect transistors (Fin-FETs). The first layout can be established by selecting cells from a first (original) library, in which the Fin FET cells can have the same fin height.

In block 404, data representing configurations of a plurality of Fin-FETs having different fin heights can be provided and input to a processor, as described in step 222 of FIG. 2B.

In block 406, a second cell library 405 comprising a plurality of cells 407 can be generated, as described in step 226 of FIG. 2B and step 204 of FIG. 2A. Each of the plurality of cells 407 in the cell library 405 is displayed with a respectively different marker indicating a respective fin height. In some embodiments, the criteria for generating a cell library 405 include timing (speed) and power consumption as described in step 224 of FIG. 2B. The plurality of cells 407 having different fin heights in the cell library 405 corresponds to the plurality of cells in the first layout of a semiconductor device in some embodiments.

In some other embodiments, there are two pre-characterized libraries: the first library including a plurality of cells having fins with normal fin heights, and the second cell library 405 comprising a plurality of cells 407 having fins with higher fin heights. The plurality of cells 407 in the second cell library 405 are the same set of cells as in the first library except different fin heights. The cells in the two libraries are pre-characterized with different performance parameters, leakage and other characteristics.

In an alternative embodiment, each Fin-FET in the first (original) library is supplemented by one or more corresponding Fin-FETs in the second library with different fin heights. The plurality of Fin-FETs in the plurality of cells of the first layout may not be specified.

In block 408, at least one cell from the cell library can be placed (or replaced) in a respective location in the first layout of the semiconductor device to generate, in the processor, a second layout for the semiconductor device to be fabricated, as described in step 206 of FIG. 2A. At least some of the plurality of cells in the first layout are also replaced with one or more of the plurality of cells from the cell library, based on a set of performance specifications for the semiconductor device.

Block 410 illustrates a set of performance specifications as described in step 234 of FIG. 2C. The set of performance specifications can include at least one of an area for the semiconductor device, speed, power consumption and signal slew rate balance of the semiconductor device. The set of performance specifications can also include some performance specifications for at least one critical path. The set of performance specifications in block 410 are used for optimization of cell replacement in block 408.

In block 412, the second layout 415 for the semiconductor device to be fabricated is output from the processor. Different cells 414, 416, and 418 in the second layout 415 have different markers for different fin heights.

Figure 5:
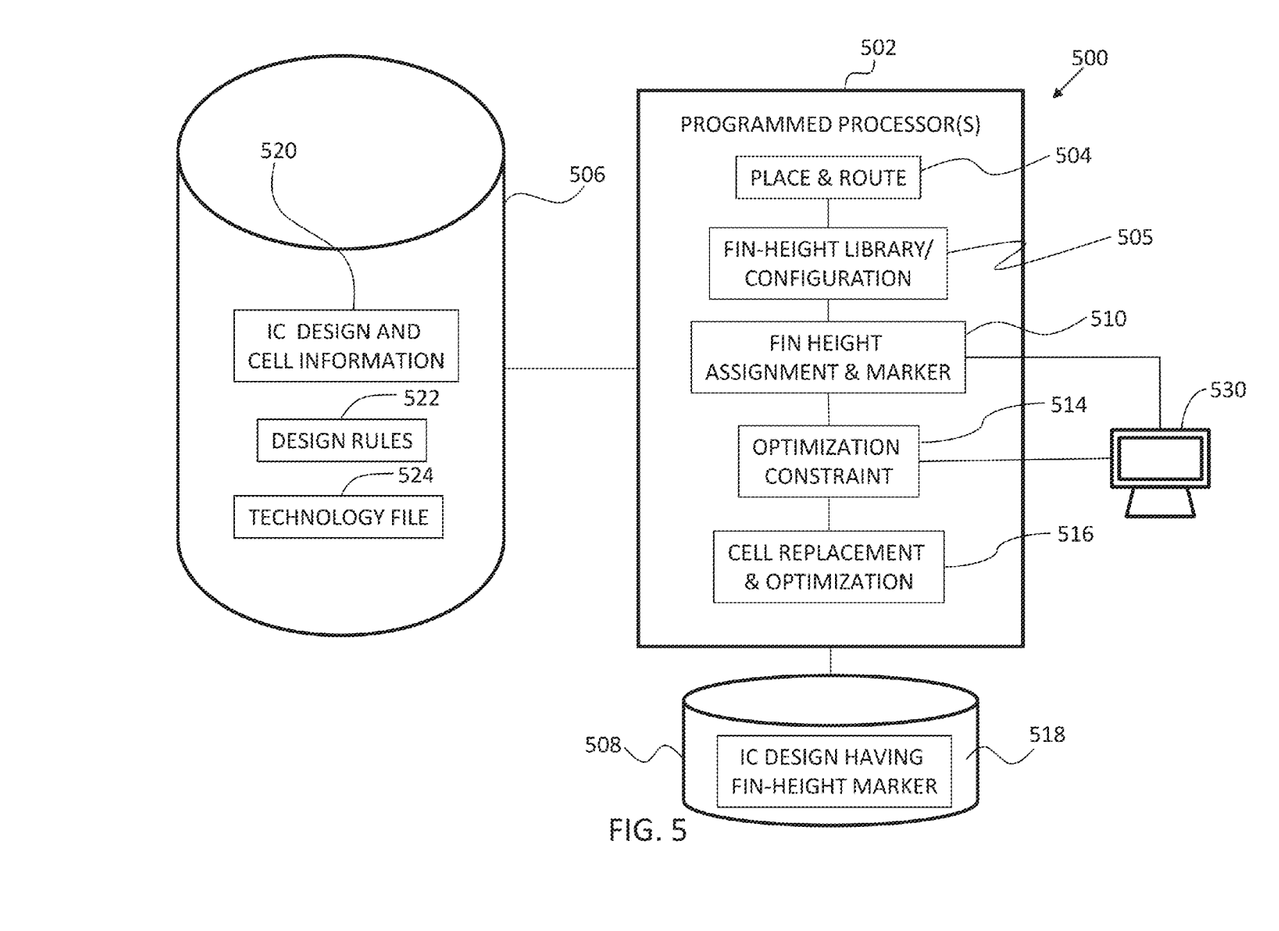
FIG. 5 is a block diagram illustrating an embodiment of a system for performing a method as described herein.

FIG. 5 is a block diagram of an embodiment of a system 500 for performing the method 200 for generating a design of a semiconductor device as described herein.

System 500 comprises at least a non-transitory, machine readable storage medium 506, and a processor 502 coupled to access the storage medium 506. The storage medium 506 is encoded with data representing a first layout of a semiconductor device comprising a plurality of cells representing circuit elements. The circuit elements comprise Fin-FETs. The processor 502 is programmed to perform a method 200 as described above.

Referring to FIG. 5, processor 502 indicates that one or more programmed processors may be included. In some embodiments, the processing load is performed by two or more application programs, each operating on a separate processor. In other embodiments, the processors are all performed using one processor. Similarly, two media 506 and 508 are shown, but the data may be stored in any number of media. Although FIG. 5 shows an allocation of the various tasks to specific modules, this is only one example. The various tasks may be assigned to different modules to improve performance, or improve the ease of programming.

System 500 includes an electronic design automation ("EDA") tool such as "IC COMPILER"™, sold by Synopsys, Inc. of Mountain View, Calif., which may include a place and route tool 504, such as "ZROUTE"™, also sold by Synopsys. Other EDA tools may be used, such as the "VIRTUOSO" custom design platform or the Cadence "ENCOUNTER"® digital IC design platform may be used, along with the "VIRTUOSO" chip assembly router 504, all sold by Cadence Design Systems, Inc. of San Jose, Calif.

The EDA tool is a special purpose computer formed by retrieving stored program instructions from a non-transient computer readable storage medium 506 and executing the instructions on a general purpose processor 502. Thus, the instructions configure the logic circuits of the processor 502 to function as an EDA tool. Examples of non-transient computer readable storage mediums 506, 508 include, but are not limited to, hard disk drives (HDD), read only memories ("ROMs"), random access memories ("RAMs"), flash memories, or the like. Tangible, non-transient machine readable storage mediums 506, 508 are configured to store data generated by the place and route tool 504.

The router of the place and route tool 504 is capable of receiving the first layout comprising information for IC design and cells 520. Router 504 may be equipped with a set of default design rules 522 and technology file 524.

In processor 602, different modules are configured to perform a method as described above. For example, module 505 is configured to provide or input different configurations of a plurality of cells having different fin heights for a cell library. Module 510 is configured to select and assign a fin height to a respective cell, and also assign a marker to the respective cell indicating the fin height. Module 514 is configured to provide a set of performance specifications or constraints for the optimization of cell replacement as described above. Module 516 is configured to perform optimization of cell replacement to provide the second layout for the semiconductor device to be fabricated (i.e. the IC design 518 having different fin-height marker to be stored in a non-transitory machine readable storage medium 508).

A graphical interface facilitates the design process by displaying results generated through programmed modules 505, 510, 514 and 516 in processor 502. These results include data representing configurations of a plurality of Fin-FETs having different fin heights, the cell library comprising cells with different fin heights, cell placement during the step of optimization, and the resulting second layout. In some embodiments, a display 530 displays a graphical representation of the layout graph, and assists the user such as design engineers in the layout optimization decisions. For example, a set of optional cell placements can be displayed. When one of the cells having a respective different fin height replaces a respective cell in the first layout. The resulting performance parameters can be then displayed. A design engineer can make a decision whether to have such a cell replacement in the second layout. In the second layout, the at least one cell from the cell library comprising a Fin-FET with a respective fin height different is displayed with a respectively different marker, for example, different color, shading style, or the like. Based on the respectively different marker, a processing engineer can determine the processing steps needed to make such a semiconductor device. In some embodiments, the IC layout is generated using an EDA tool. The method 200, which is computer implemented, is performed on a separate specifically programmed processor.

This present disclosure provides a method and a system for generating a design of a semiconductor device. The method comprises providing a first layout of a semiconductor device comprising a plurality of cells representing circuit elements, providing a cell library comprising a plurality of cells in a processor, and generating, in the processor, a second layout for the semiconductor device to be fabricated. The circuit elements comprise a plurality of fin field effect transistors (Fin-FETs). Each of the plurality of cells in the cell library is displayed with a respectively different marker indicating a respective fin height. The second layout is generated by placing or replacing at least one cell from the cell library in a respective location in the first layout of the semiconductor device. The at least one cell from the cell library comprises a Fin-FET with a respective fin height different from an adjacent Fin-FET in the second layout of the semiconductor device.

In some embodiments, the plurality of cells in the first layout of the semiconductor device comprises Fin-FETs having the same fin height. In some embodiments, the step of providing a cell library comprises inputting, to a processor, data representing configurations of a plurality of Fin-FETs having different fin heights, generating, in the processor, a cell library comprising a plurality of cells. Each of the plurality of cells in the cell library is displayed with a respectively different marker indicating a respective fin height.

In some embodiments, the step of providing a cell library further comprises selecting a respective fin height for a least one Fin-FET in the cell library so that the at least one Fin-FET has a different speed or different power consumption from a respective Fin-FET in the first layout. In some embodiments, the cell library has at least one Fin-FET with higher speed and lower power consumption than a respective Fin-FET in the first layout of the semiconductor device.

In some embodiments, the step of generating the second layout of the semiconductor device comprises: placing at least one cell from the cell library in a respective location in the first layout, and replacing at least some of the plurality of cells in the first layout with one of the plurality of cells from the cell library, based on a set of performance specifications for the semiconductor device. In some embodiments, the set of performance specifications in the step of replacing each of the plurality of cells comprise at least one of an area for the semiconductor device, speed, power consumption and signal slew rate balance of the semiconductor device.

In some embodiments, a respective one of the plurality of cells in the first layout of the semiconductor device is replaced with a respective cell from the cell library having a higher fin height and a lower gate threshold voltage than the one of the plurality of cells.

In some embodiments, the step of replacing each of the plurality of cells further comprises identifying at least one critical path of the semiconductor device, analyzing performance parameters of the at least one critical path, and changing at least one cell in the at least one critical path so as to meet the set of performance specifications for the semiconductor device.

In some embodiments, the method further comprises routing to connect the plurality of cells in the second layout for the semiconductor device to be fabricated. The method can further comprise outputting, from the processor, the second layout for the semiconductor device to be fabricated.

In some embodiments, the present disclosure provides a method for generating a design of a semiconductor device comprising the following steps. A first layout of a semiconductor device is provided. The first layout comprises a plurality of cells representing circuit elements, which comprises a plurality of fin field effect transistors (Fin-FETs). The method comprises inputting, to a processor, data representing configurations of a plurality of Fin-FETs having different fin heights, and generating, in the processor, a cell library comprising a plurality of cells. Each of the plurality of cells in the cell library is displayed with a respectively different marker indicating a respective fin height. The method further comprises placing at least one cell from the cell library in a respective location in the first layout of the semiconductor device to generate, in the processor, a second layout for the semiconductor device to be fabricated. At least some of the plurality of cells in the first layout are also replaced with one of the plurality of cells from the cell library, based on a set of performance specifications for the semiconductor device. The at least one cell from the cell library comprises a Fin-FET with a respective fin height different from an adjacent Fin-FET in the second layout of the semiconductor device. The set of performance specifications in the step of replacing each of the plurality of cells comprise at least one of an area for the semiconductor device, speed, power consumption and signal slew rate balance of the semiconductor device.

In some embodiments, the method further comprises selecting a respective fin height for a least one Fin-FET in the cell library so that the at least one Fin-FET has a different speed or different power consumption from a respective Fin-FET in the first layout of the semiconductor device.

In some embodiments, the method further comprises routing to connect the plurality of cells in the second layout for the semiconductor device to be fabricated, and outputting, from the processor, the second layout for the semiconductor device to be fabricated.

This present disclosure also provides a system comprising a non-transitory, machine readable storage medium and a processor. The non-transitory, machine readable storage medium is encoded with data representing a first layout of a semiconductor device comprising a plurality of cells representing circuit elements, the circuit elements comprising Fin-FETs. The processor is coupled to access the storage medium, the processor programmed to perform a method as described above.

The methods and system described herein may be at least partially embodied in the form of computer-implemented processes and apparatus for practicing those processes. The disclosed methods may also be at least partially embodied in the form of tangible, non-transient machine readable storage media encoded with computer program code. The media may include, for example, RAMs, ROMs, CD-ROMs, DVD-ROMs, BD-ROMs, hard disk drives, flash memories, or any other non-transient machine-readable storage medium, or any combination of these mediums, wherein, when the computer program code is loaded into and executed by a computer, the computer becomes an apparatus for practicing the method. The methods may also be at least partially embodied in the form of a computer into which computer program code is loaded and/or executed, such that, the computer becomes an apparatus for practicing the methods. When implemented on a general-purpose processor, the computer program code segments configure the processor to create specific logic circuits. The methods may alternatively be at least partially embodied in a digital signal processor formed of application specific integrated circuits for performing the methods.

Although the subject matter has been described in terms of exemplary embodiments, it is not limited thereto. Rather, the appended claims should be construed broadly, to include other variants and embodiments, which may be made by those skilled in the art.

What is claimed is:

1. A method comprising:
providing a first layout of a semiconductor device comprising a plurality of cells representing circuit elements, the circuit elements comprising a plurality of fin field effect transistors (Fin-FETs);
providing a cell library comprising a plurality of cells in a processor, wherein each of the plurality of cells in the cell library is displayed with a respectively different marker indicating a respective fin height, wherein the step of providing a cell library further comprises selecting a respective fin height for at least one Fin-FET in the cell library so that the at least one Fin-FET has a different speed or different power consumption from a respective Fin-FET in the first layout of the semiconductor device; and
generating, in the processor, a second layout for the semiconductor device to be fabricated, by placing or replacing at least one cell from the cell library in a respective location in the first layout of the semiconductor device, wherein the at least one cell from the cell library comprises a Fin-FET with a respective fin height different from an adjacent Fin-FET in the second layout of the semiconductor device.

2. The method of claim 1, wherein
the plurality of cells in the first layout of the semiconductor device comprises Fin-FETs having the same fin height.

3. The method of claim 1, wherein the step of providing a cell library comprises
inputting, to a processor, data representing configurations of a plurality of Fin-FETs having different fin heights;
generating, in the processor, a cell library comprising a plurality of cells, wherein each of the plurality of cells in the cell library is displayed with a respectively different marker indicating a respective fin height.

4. The method of claim 3, wherein
the cell library has at least one Fin-FET with higher speed and lower power consumption than a respective Fin-FET in the first layout of the semiconductor device.

5. The method of claim 1, wherein the step of generating the second layout of the semiconductor device comprises:
placing at least one cell from the cell library in a respective location in the first layout of the semiconductor device; and
replacing at least some of the plurality of cells in the first layout with one of the plurality of cells from the cell library, based on a set of performance specifications for the semiconductor device.

6. The method of claim 5, further comprising:
routing to connect the plurality of cells in the second layout for the semiconductor device to be fabricated.

7. The method of claim 5, further comprising:
outputting, from the processor, the second layout for the semiconductor device to be fabricated.

8. The method of claim 5, wherein
the set of performance specifications in the step of replacing each of the plurality of cells comprise at least one of an area for the semiconductor device, speed, power consumption and signal slew rate balance of the semiconductor device.

9. The method of claim 5, wherein
a respective one of the plurality of cells in the first layout of the semiconductor device is replaced with a respective cell from the cell library having a higher fin height and a lower gate threshold voltage than the one of the plurality of cells.

10. The method of claim 5, wherein the step of replacing each of the plurality of cells further comprises
identifying at least one critical path of the semiconductor device;
analyzing performance parameters of the at least one critical path; and
changing at least one cell in the at least one critical path so as to meet the set of performance specifications for the semiconductor device.

11. A method for generating a design of a semiconductor device, comprising:
providing a first layout of a semiconductor device comprising a plurality of cells representing circuit elements, the circuit elements comprising a plurality of fin field effect transistors (Fin-FETs);
inputting, to a processor, data representing configurations of a plurality of Fin-FETs having different fin heights;
selecting a respective fin height for at least one Fin-FET in the cell library so that the at least one Fin-FET has a different speed or different power consumption from a respective Fin-FET in the first layout of the semiconductor device;
generating, in the processor, a cell library comprising a plurality of cells, wherein each of the plurality of cells in the cell library is displayed with a respectively different marker indicating a respective fin height;
placing at least one cell from the cell library in a respective location in the first layout of the semiconductor device to generate, in the processor, a second layout for the semiconductor device to be fabricated; and
replacing at least some of the plurality of cells in the first layout with one of the plurality of cells from the cell library, based on a set of performance specifications for the semiconductor device;
wherein the at least one cell from the cell library comprises a Fin-FET with a respective fin height different from an adjacent Fin-FET in the second layout of the semiconductor device.

12. The method of claim 11, wherein
the set of performance specifications in the step of replacing each of the plurality of cells comprise at least one of an area for the semiconductor device, speed, power consumption and signal slew rate balance of the semiconductor device.

13. The method of claim 11, further comprising:
routing to connect the plurality of cells in the second layout for the semiconductor device to be fabricated; and
outputting, from the processor, the second layout for the semiconductor device to be fabricated.

14. A system, comprising:
a non-transitory, machine readable storage medium encoded with data representing a first layout of a semiconductor device comprising a plurality of cells representing circuit elements, the circuit elements comprising fin field effect transistors (Fin-FETs); and a processor coupled to access the storage medium, the processor programmed to perform a method comprising:
  providing a cell library comprising a plurality of cells in a processor, wherein each of the plurality of cells in the cell library is displayed with a respectively different marker indicating a respective fin height, wherein a respective fin height is selected for at least one Fin-FET in the cell library so that the at least one Fin-FET has a different speed or different power consumption from a respective Fin-FET in the first layout of the semiconductor device; and
  generating, in the processor, a second layout for the semiconductor device to be fabricated, by placing or replacing at least one cell from the cell library in a respective location in the first layout of the semiconductor device,
  wherein the at least one cell from the cell library comprises a Fin-FET with a respective fin height different from an adjacent Fin-FET in the second layout of the semiconductor device.

15. The system of claim 14, wherein the processor is configured to perform the method further comprising:
  placing at least one cell from the cell library in a respective location in the first layout of the semiconductor device; and
  replacing at least some of the plurality of cells in the first layout with one of the plurality of cells from the cell library, based on a set of performance specifications for the semiconductor device.

16. The system of claim 15, wherein in the method the processor is configured to perform,
  the set of performance specifications in the step of replacing each of the plurality of cells comprise at least one of an area for the semiconductor device, speed, power consumption and signal slew rate balance of the semiconductor device.

17. The system of claim 14, wherein the processor is configured to perform the method further comprising:
  routing to connect the plurality of cells in the second layout for the semiconductor device to be fabricated; and
  outputting, from the processor, the second layout for the semiconductor device to be fabricated.

* * * * *